(12) United States Patent
Van Den Biggelaar

(10) Patent No.: US 7,294,844 B2
(45) Date of Patent: Nov. 13, 2007

(54) LITHOGRAPHIC APPARATUS, DEVICE MANUFACTURING METHOD, AND DEVICE MANUFACTURED THEREBY

(75) Inventor: Petrus Marinus Christianus Van Den Biggelaar, Nuenen (NL)

(73) Assignee: ASML Netherlands B.V., Veldhoven (NL)

( * ) Notice: Subject to any disclaimer, the term of this patent is extended or adjusted under 35 U.S.C. 154(b) by 591 days.

(21) Appl. No.: 10/894,368

(22) Filed: Jul. 20, 2004

(65) Prior Publication Data

US 2005/0041227 A1 Feb. 24, 2005

(30) Foreign Application Priority Data

Jul. 21, 2003 (EP) .................................. 03077301

(51) Int. Cl.
*G03B 27/42* (2006.01)

(52) U.S. Cl. .............. 250/492.2; 250/400; 250/492.22; 250/492.21

(58) Field of Classification Search ...................... None
See application file for complete search history.

(56) References Cited

U.S. PATENT DOCUMENTS

| | | | |
|---|---|---|---|
| 4,563,820 A | 1/1986 | Isohata | |
| 5,229,872 A | 7/1993 | Mumola | |
| 5,296,891 A | 3/1994 | Vogt et al. | |
| 5,523,193 A | 6/1996 | Nelson | |
| 5,969,441 A | 10/1999 | Loopstra et al. | |
| 6,046,792 A | 4/2000 | Van Der Werf et al. | |
| 6,204,911 B1 | 3/2001 | Kurosawa et al. | |
| 2002/0078429 A1 | 6/2002 | Yoshida | |

FOREIGN PATENT DOCUMENTS

| | | |
|---|---|---|
| EP | 1 170 636 | 1/2002 |
| JP | 61-87330 | 5/1986 |
| WO | WO98/33096 | 7/1998 |
| WO | WO98/38597 | 9/1998 |
| WO | WO98/40791 | 9/1998 |

*Primary Examiner*—Jack I. Berman
*Assistant Examiner*—Zia R. Hashmi
(74) *Attorney, Agent, or Firm*—Pillsbury Winthrop Shaw Pittman LLP

(57) ABSTRACT

A lithographic apparatus is presented that provides versatile processing time and accuracy selection. The apparatus includes a substrate holder configured to hold a substrate; a radiation system configured to condition a beam of radiation; a support structure configured to support a patterning device that imparts a desired pattern onto the beam of radiation; a projection system that projects the patterned beam onto a target portion of the substrate; and a selection system that selects one out of at least two different operational modes of the lithographic apparatus. The first operational mode is associated with performing a process within a first time period at a first level of accuracy and a second operational mode is associated with performing the process within a second time period at a second level of accuracy. The first time period is shorter than the second time period and the first level of accuracy is lower than the second level of accuracy.

24 Claims, 2 Drawing Sheets

LITHOGRAPHIC APPARATUS, DEVICE MANUFACTURING METHOD, AND DEVICE MANUFACTURED THEREBY

BACKGROUND OF THE INVENTION

1. Priority Information

This application claims priority from European Patent Application No. 03077301.4, filed Jul. 21, 2003, the contents of which is herein incorporated by reference in its entirety.

2. Field of the Invention

The present invention relates to a lithographic apparatus, a device manufacturing method, and a device manufactured thereby.

3. Description of the Related Art

Lithographic apparatus can be used, for example, in the manufacture of integrated circuits (ICs). In such a case, a patterning device may be used to generate a desired circuit pattern corresponding to an individual layer of the IC, and this pattern can be imaged onto a target portion (e.g. comprising one or more dies) on a substrate (silicon wafer) that has been coated with a layer of radiation-sensitive material (resist).

The term "patterning device" as here employed should be broadly interpreted as referring to a device that can be used to impart an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning devices include:

- a mask: the concept of a mask is well known in lithography, and it includes mask types such as binary, alternating phase-shift, and attenuated phase-shift, as well as various hybrid mask types. Placement of such a mask in the radiation beam causes selective transmission (in the case of a transmission mask) or reflection (in the case of a reflective mask) of the radiation impinging on the mask, according to the pattern on the mask. In the case of a mask, the support structure will generally be a mask table/holder/holder, which ensures that the mask can be held at a desired position in the incoming radiation beam, and that it can be moved relative to the beam if so desired;
- a programmable mirror array: one example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as non-diffracted light. Using an appropriate filter, the non-diffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation mechanism. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described here above, the patterning device can comprise one or more programmable mirror arrays. More information on mirror arrays as here referred to can be gleaned, for example, from United States patents U.S. Pat. No. 5,296,891 and U.S. Pat. No. 5,523,193, and PCT patent applications WO 98/38597 and WO 98/33096, which are incorporated herein by reference. In the case of a programmable mirror array, the support structure may be embodied as a frame or table, for example, which may be fixed or movable as required; and
- a programmable LCD array: an example of such a construction is given in United States patent U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table/holder/holder; however, the general principles discussed in such instances should be seen in the broader context of the patterning device as set forth here above.

In general, a single wafer will contain a whole network of adjacent target portions that are successively irradiated via the projection system, one at a time. In current apparatus, employing patterning by a mask on a mask table/holder/holder, a distinction can be made between two different types of machine. In one type of lithographic projection apparatus, each target portion is irradiated by exposing the entire mask pattern onto the target portion in one go; such an apparatus is commonly referred to as a wafer stepper.

In an alternative apparatus—commonly referred to as a step-and-scan apparatus—each target portion is irradiated by progressively scanning the mask pattern under the projection beam in a given reference direction (the "scanning" direction) while synchronously scanning the substrate table/holder/holder parallel or anti-parallel to this direction. Since, in general, the projection system will have a magnification factor M (generally <1), the speed V at which the substrate table/holder/holder is scanned will be a factor M times that at which the mask table/holder/holder is scanned. More information with regard to lithographic devices as here described can be gleaned, for example, from U.S. Pat. No. 6,046,792, incorporated herein by reference.

In a device manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example, whereby any of these types of projection system may either be suitable for conventional imaging or be suitable for imaging in the presence of an immersion fluid. The radiation system may also include components operating according to any of these design types for directing, shaping, or controlling the projection beam of radiation, and such components may also be referred to below, collectively or singularly, as a "lens". Further, the lithographic apparatus may be of a type having two or more substrate tables/holders (and/or two or more mask tables/holders). In such "multiple stage" machines the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

A lithographic apparatuses are designed and manufactured to meet certain specifications of device manufacturers. The specifications usually comprise details with regard to the accuracy of the processes to be carried out with the lithographic apparatus as well as the number of devices which can be made per unit of time with one lithographic apparatus, i.e. the throughput of one apparatus. The accuracy with which processes are carried out may affect the smallest size of functional features which can be produced on a substrate, using the lithographic apparatus. The apparatus is usually designed such that processes are carried out with a particular accuracy whilst achieving a particular throughput.

If production of certain devices requires a higher accuracy, usually another apparatus has to be used by the manufacturer of the devices. The throughput of that other apparatus will generally be less than the apparatus which carries out processes with the lesser accuracy. Likewise, if higher throughput is required (which may less likely to be of higher importance than the accuracy), usually another apparatus has to be used by the manufacturer of the devices. The accuracy of that other apparatus will generally be less than the apparatus with the lesser throughput. In any case, two different apparatuses are required if different accuracies and/or if different throughputs are requested.

SUMMARY OF THE INVENTION

The principles of the present invention, as embodied and broadly described herein, provide a lithographic apparatus that is more versatile with respect to the possible requirements of a manufacturer of devices. In one embodiment, the lithographic apparatus comprises a substrate holder configured to hold a substrate; a radiation system configured to condition a beam of radiation; a support structure configured to support a patterning device that imparts a desired pattern onto the beam of radiation; a projection system that projects the patterned beam onto a target portion of the substrate; and a selection system that selects one out of at least two different operational modes of the lithographic apparatus. The first operational mode is associated with performing a process within a first time period at a first level of accuracy and a second operational mode is associated with performing the process within a second time period at a second level of accuracy. The first time period is shorter than the second time period and the first level of accuracy is lower than the second level of accuracy.

With only one of such an apparatus a manufacturer of devices is able to manufacture in for instance a first period of time, a number of devices which only need to meet relatively low accuracy specifications, and, after using the selection system, to manufacture, in a second period of time, a number of devices which need to meet relatively high accuracy requirements. If the first period of time and the second period of time are of equal length, the number of devices produced in the first period will be higher than the number of devices produced in the second period. However, although the throughput is less in the second period; the manufacturer saves money due to the fact that only one lithographic apparatus needs to be purchased, if the apparatus concerns an apparatus according to the invention. As a result, the devices can be produced with relatively low costs.

It should be noted that these operational modes are different from modes such as the step mode and the scan mode, which refer to a stationary mask table and a moveable mask table, respectively.

It is possible that the different operational modes only differ in the period of time in which a process is performed and in the level of accuracy involved. In other words, throughput and accuracy of the features on a device are coupled. Selecting an operational mode allows thus for selecting a particular throughput and accuracy of the devices to be produced.

In an embodiment of a lithographic apparatus according to the invention the selection system is arranged to be controlled by a user. This ensures that no technician of the manufacturer of the lithographic apparatus needs to be called out to adapt the apparatus such that one out of the at least two different operational modes is selected. The apparatus does also not need to be transported back to the manufacturer of the apparatus or a service center. In short, the user-controllability of the selection system allows for flexibility in the use of the apparatus, ultimately leading to lower costs of the devices produced with the apparatus.

It is possible that the selection system is controllable via a user-interface. In that case the apparatus and the selection system are user-friendly. The user-interface may comprise a display with a touch screen or a keyboard to conveniently control the selection system. No particular skills will be required from the user.

In a particular embodiment of the invention the selection system is arranged to allow for selection of one out of a number of operational modes, the number being larger than two. In this embodiment, a large number of combinations of time for a particular process which is to be carried out by the lithographic apparatus and accuracy with which that process is to be carried out, is selectable, allowing for even more versatile use of the apparatus, for instance depending on the needs.

It is possible that the number of operational modes are related to each other according to a predetermined relationship which can be visualized in a graph as a line.

It is also possible that the line is continuous and/or free from steps, allowing for pricing of the devices produced more or less in relation to the time used by the apparatus for the production of a certain number of devices. Hiring out the apparatus for a period of time is for instance possible, also when potential clients have mutually different needs.

In an embodiment of the apparatus according to the invention the process comprises at least one selected from the group consisting of: transporting the substrate and/or substrate table, settling of the substrate after transport, aligning the radiation system, settling of the radiation system after aligning, aligning of the support structure, settling of the support structure after aligning, aligning of the patterning device, settling of the patterning device after aligning, aligning of the projection system, settling of the patterning device after aligning, tilting of the substrate, settling after tilting, focusing of the projection system, exposing of the substrate tot the patterned beam, and any combinations thereof.

It is thus possible that a selected operational mode results in a particular velocity and/or different acceleration or deceleration for the transport of the substrate and/or substrate table. It is possible that certain steps in alignment procedures can be shortened and/or cancelled at all, especially if these procedures are involved with achieving an accuracy not needed for a selected operational mode. Iterative procedures can be prolonged or shortened, depending on the selected operational mode. Also the settling time, the time in which disturbances due to movements and/or thermal instability damp out to an acceptable level can be shortened or prolonged, as the acceptable level is related to the required accuracy and thus to the selected operational mode.

In an embodiment of the apparatus according to the invention the apparatus is arranged to select in each operational mode particular operation settings, wherein each operation setting comprises a combination of a predetermined period of time in which a particular process is to be carried out by the lithographic apparatus and a predetermined level of accuracy with which that process is to be carried out. This allows for selecting a set of combinations with predetermined settings, providing convenience to the user and a fast preparation for operation of the apparatus.

In an embodiment the apparatus comprises a control-unit which is arranged to determine of at least one process step of the process a process time for obtaining a required accuracy or a process accuracy for obtaining a required process time. This allows for optimizing the manufacturer of a device. This embodiment may employ an expert system for this optimizing.

According to a further embodiment of the invention there is provided a device manufacturing method comprising providing a substrate that is at least partially covered by a layer of radiation-sensitive material; conditioning a beam of radiation; applying a patterning device to configure the conditioned beam of radiation with a desired pattern in its cross-section; projecting the patterned beam of radiation onto a target portion of the substrate; and selecting one out of at least two different operational modes. A first operational mode is associated with performing a process within a first time period at a first level of accuracy and a second operational mode is associated with performing the process within a second time period at a second level of accuracy. The first time period is shorter than the second time period and the first level of accuracy is lower than the second level of accuracy.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5-20 nm), as well as particle beams, such as ion beams or electron beams.

BRIEF DESCRIPTION OF DRAWINGS

Embodiments of the invention will now be described, by way of example only, with reference to the accompanying schematic drawings in which corresponding reference symbols indicate corresponding parts, and in which.

DETAILED DESCRIPTION OF THE INVENTION

Figure 1:
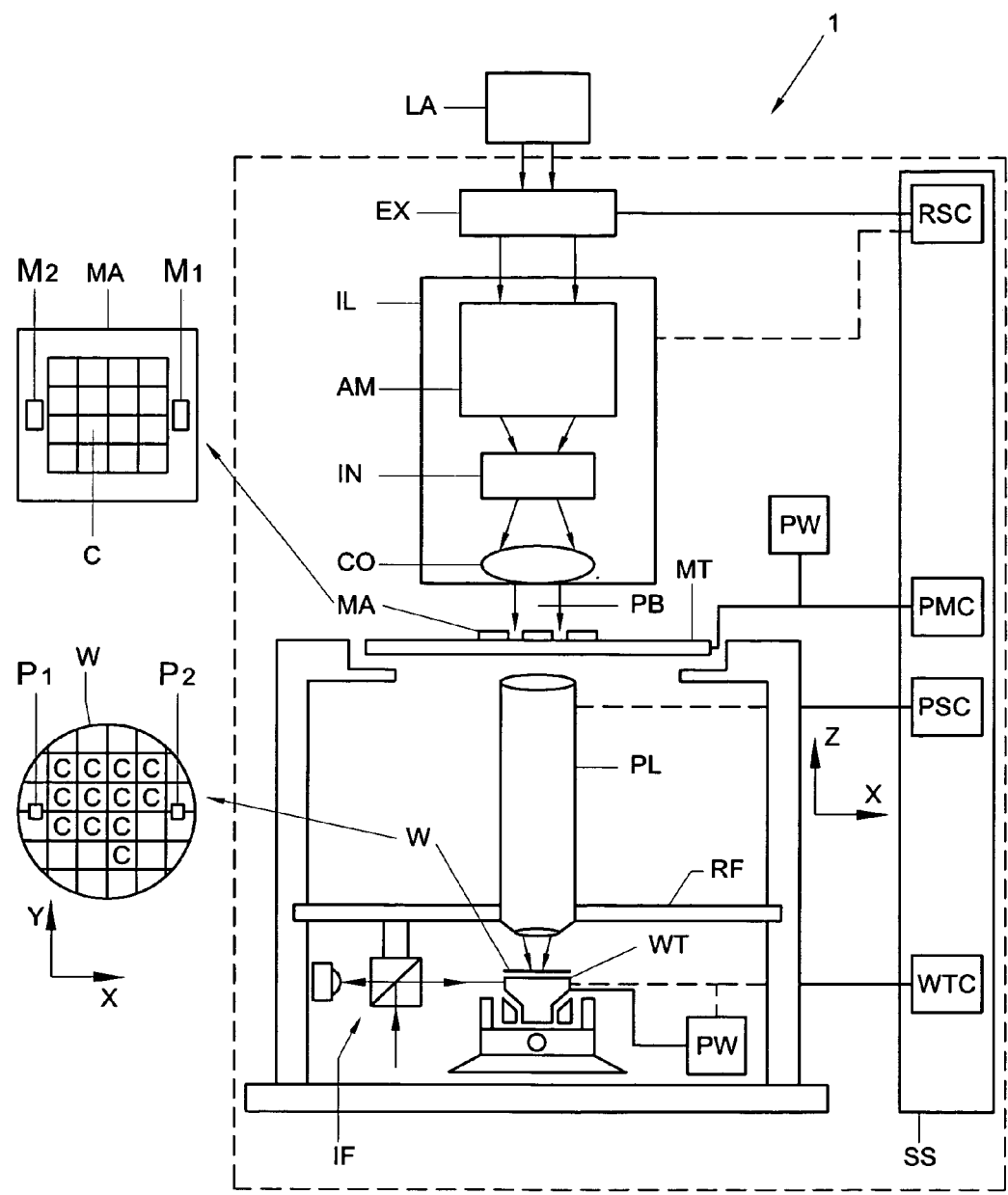
FIG. 1 depicts a lithographic projection apparatus according to a first embodiment of the invention.

FIG. 1 schematically depicts a lithographic projection apparatus 1 according to a particular embodiment of the invention. The apparatus comprises:

a radiation system Ex, IL: for supplying a projection beam PB of radiation (e.g. EUV, DUV, or UV radiation). In this particular case, the radiation system also comprises a radiation source LA;

•a first object table (mask table/holder/holder) MT: provided with a mask holder for holding a mask MA (e.g. a reticle), and connected to first positioning mechanism for accurately positioning the mask with respect to item PL;

•a second object table (substrate table/holder) WT: provided with a substrate holder for holding a substrate W (e.g. a resist-coated silicon wafer), and connected to second positioning mechanism for accurately positioning the substrate with respect to item PL;

•a projection system ("lens") PL: for example, a mirror or refractive lens system that images an irradiated portion of the mask MA onto a target portion C (comprising one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning device, such as a programmable mirror array of a type as referred to above.

The source LA produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO.

In this way, the beam PB impinging on the mask MA has a desired uniformity and intensity distribution in its cross-section.

The source LA produces a beam of radiation. This beam is fed into an illumination system (illuminator) IL, either directly or after having traversed conditioning means, such as for example a beam expander Ex. The illuminator IL may comprise adjusting means AM for adjusting the angular intensity distribution in the beam. Generally, at least the outer and/or inner radial extent (commonly referred to as σ-outer and σ-inner, respectively) of the intensity distribution in a pupil plane of the radiation system can be adjusted. In addition, the illuminator IL will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently impinges on the mask MA, which is held on a mask table MT. Reflected from the mask MA, the beam PB passes through the lens PL, which focuses the beam PB onto a target portion C of the substrate W. With the aid of the second positioning mechanism PW (and interferometric measuring means IF), the substrate table WT can be moved accurately, e.g. so as to position different target portions C in the path of the beam PB. Similarly, the first positioning mechanism PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in different modes:

step mode: the mask table MT is kept essentially stationary, and an entire mask image is projected in one go (i.e. a single "flash") onto a target portion C. The substrate table WT is then shifted in the X and/or Y directions so that a different target portion C can be irradiated by the beam PB;

scan mode; essentially the same scenario applies, except that a given target portion C is not exposed in a single "flash". Instead, the mask table MT is movable in a given direction (the so-called "scan direction", e.g. the Y-direction) with a speed v, so that the projection beam PB is caused to scan over a mask image; concurrently, the substrate table WT is simultaneously moved in the same or opposite direction at a speed V=M v, in which M is the magnification of the lens PL (typically, M=1/4 or 1/5). In this manner, a relatively large target portion C can be exposed, without having to compromise on resolution; and other mode: the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

The embodiment shown in FIG. 1 further comprises a selection system SS for selecting one out of at least two different operational modes of the lithographic apparatus. In a first operational mode of the at least two operational modes, a process is performed during a first period of time and with a first level of accuracy. In a second operational mode of the at least two operational modes a process is performed in a second period of time and with a second level of accuracy.

The first period of time is shorter than the second period of time and the first level of accuracy is lower than the second level of accuracy. The selection system (SS) shown in FIG. 1 comprises a Radiation System Control unit (RSC), a Patterning Device Control unit (PMC), Projection System Control unit (PSC), and substrate or Wafer Table Control unit (WTC). In this example, the PMC is connected with the first positioning mechanism PM and the WTC is connected with the second positioning mechanism PW. It is possible that the selection system comprises only one or some of these control units. With each of the control units it is possible to alter or modify the accuracy of, for instance, the alignment procedure and/or alter or modify the accuracy of the transport of a movable part within the apparatus. Accuracy of the alignment procedure maybe altered by changing a cut off value, which is a value at which an iterative process of alignment will be stopped.

Alternatively, it is possible to modify the length of time in which a certain process is to be carried out. If the accuracy is set, a consequence is that the time for the respective process is influenced because accuracy and time are related. That is, the higher the accuracy, the more time is needed for a process to be carried out. Although it is unlikely that the time is set, irrespective of the accuracy, it is also applicable that when the time is set, a consequence is that the accuracy with which the respective process is to be carried out is set, due to the fact that accuracy and time are related.

In the apparatus of FIG. 1, the selection system SS is arranged to be controlled by a user. However, the user needs to address each control unit separately. It is possible that the selection system is arranged to allow for selection one out of a large number of operational settings.

Figure 2:
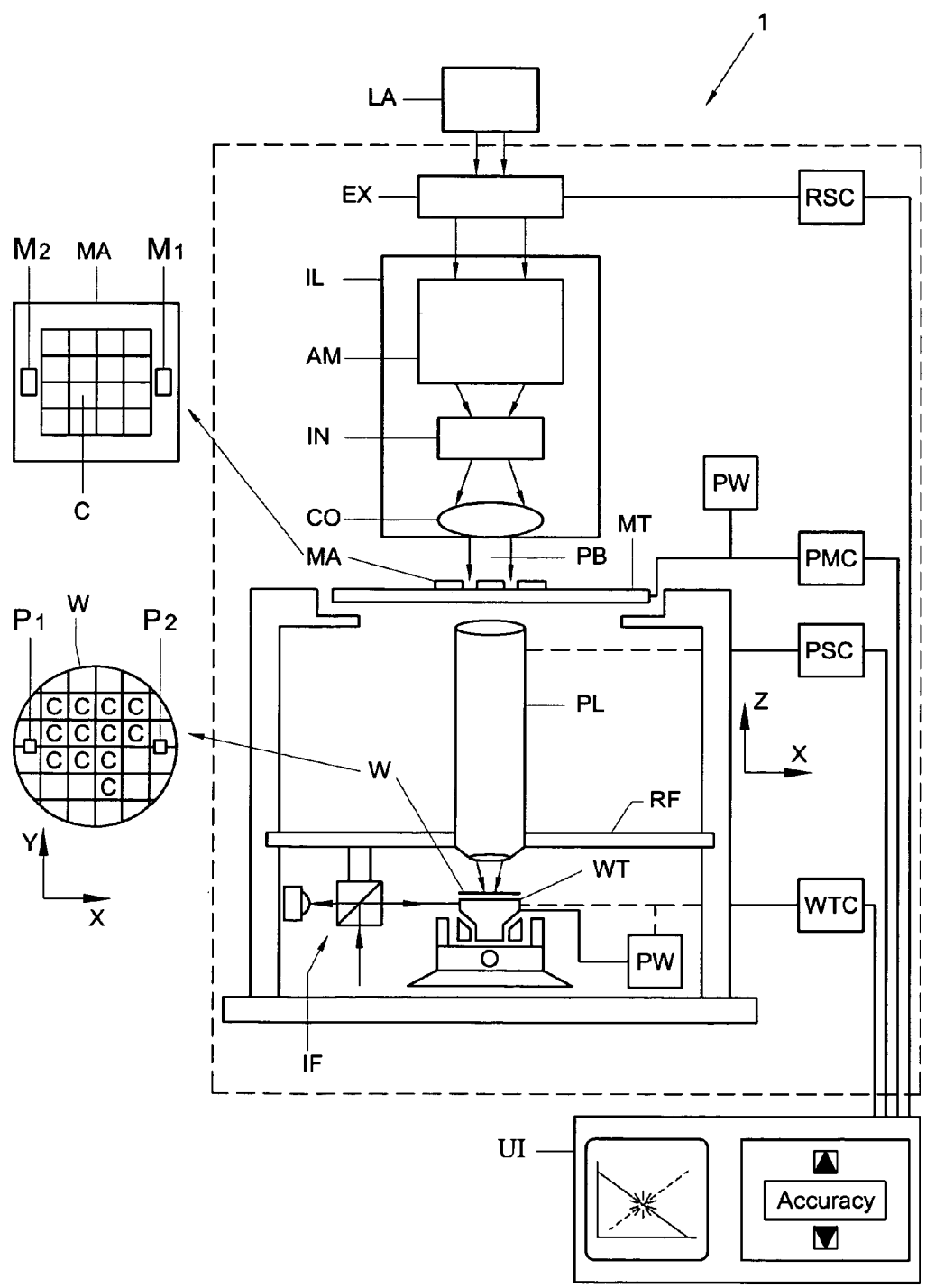
FIG. 2 depicts a lithographic projection apparatus according to a second embodiment of the invention.

FIG. 2 illustrates an alternative embodiment of a lithographic apparatus according to the invention. This embodiment is similar to the first embodiment and may comprise all the features described for the first embodiment. In this case, however, the apparatus additionally includes a User Interface (UL). The selection system SS may be controllable via the User Interface U1. This has the advantage that any user conveniently can operate the selection system SS. The selection system SS may again comprise, for instance, one or more of the above-mentioned control units, RSC, PMC, PCS and WTC. The number of operating settings are related to each other according to a predetermined relationship. The user interface UI may comprise a display on which the relationship can be visualized preferably in a graph, preferably as a line which may be continuous. This line may further be free from steps.

The apparatus as described above by either figures may be arranged to select in each operational mode particular operational settings. Each operational setting comprises a combination of a predetermined time period, in which a particular process is to be carried out by the lithographic apparatus, and a predetermined level of accuracy with which the process is to be carried out.

It is also possible that the apparatus comprises a control-unit which is arranged to determine of at least one process step of the process a process time for obtaining required accuracy or a process accuracy for obtaining a required process time.

This embodiment may employ an expert system for optimizing the manufacture of a device in correspondence with a desired accuracy, a desired throughput, or both.

With either of the apparatuses shown in FIG. 1 or 2, it is possible to carryout a device manufacturing method that comprises (a) providing a substrate that is at least partially covered by a layer of radiation-sensitive material; (b) conditioning a beam of radiation; (c) applying a patterning device to configure the conditioned beam of radiation with a desired pattern in its cross-section; (d) projecting the patterned beam of radiation onto a target portion of the substrate; and (e) selecting one out of at least two different operational modes. The first operational mode is associated with performing a process within a first time period at a first level of accuracy and the second operational mode is associated with performing the process within a second time period at a second level of accuracy. As discussed above, the first time period is shorter than the second time period and the first level of accuracy is lower than the second level of accuracy.

The process referred to in the above descriptions may include, but is not limited to, one or more of the processing tasks: (a) transporting the substrate and/or substrate holder; (b) settling the substrate after transport; (c) aligning the radiation system; (d) settling the radiation system after aligning; (e) aligning the support structure; (f) settling the support structure after aligning; (g) aligning the patterning device; (h) settling the patterning device after aligning; (i) aligning the projection system; (j) settling the patterning device after aligning; (k) tilting the substrate; (l) settling after tilting; (m) focusing the projection system; (n) exposing the substrate to the patterned beam; and any combinations thereof. Each one of these mentioned processing tasks may achieve specific additional benefits through the use of the principles of the present invention.

Each processing task can, of course, be subdivided in sub-processing tasks. For instance, exposing of the substrate to the patterned beam, may comprise a number of times the beam flashes and the intensity of each flash. Both the number of times and the intensity may be subjected to alterations for the purpose of this invention.

Although the user interface UI in FIG. 2 is shown to be connected to the RSC, PMC, PSC and the WTC, it is also possible that the user interface UI is capable of wirelessly controlling the selection system SS.

While specific embodiments of the invention have been described above, it will be appreciated that the invention may be practiced otherwise than as described. As such, the description is not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. A lithographic apparatus, comprising:
    a substrate holder configured to hold a substrate;
    an illuminator configured to condition a beam of radiation;
    a support structure configured to support a patterning device that imparts a desired pattern to the beam of radiation;
    a projection system configured to project the patterned beam onto a target portion of the substrate; and
    a selection system configured to select one out of at least two different operational modes of the lithographic apparatus,
    wherein a first operational mode is associated with performing a process within a first time period at a first level of accuracy and a second operational mode is associated with performing the process within a second time period at a second level of accuracy, and
    wherein the first time period is shorter than the second time period and the first level of accuracy is lower than the second level of accuracy.

2. The lithographic apparatus of claim 1, wherein the selection system is arranged to be controlled by a user.

3. The lithographic apparatus of claim 1, wherein the selection system is controllable via a user-interface.

4. The lithographic apparatus of claim 1, wherein the selection system is arranged to allow a selection of one out of more than two operational modes.

5. The lithographic apparatus of claim 4, wherein the operational modes are related to each other according to a predetermined relationship.

6. The lithographic apparatus of claim 5, wherein the predetermined relationship can be visualized in a graph as a line.

7. The lithographic apparatus of claim 6, wherein the line is free from steps.

8. The lithographic apparatus of claim 1, wherein each operational mode comprises operational settings, each operational setting comprising a combination of a predetermined time period and a predetermined level of accuracy with which the associated process is to be performed.

9. The lithographic apparatus of claim 1, wherein the process comprises transporting the substrate and/or substrate holder.

10. The lithographic apparatus of claim 1, wherein the process comprises settling the substrate after transport.

11. The lithographic apparatus of claim 1, wherein the process comprises aligning the illuminator.

12. The lithographic apparatus of claim 1, wherein the process comprises settling the illuminator after aligning.

13. The lithographic apparatus of claim 1, wherein the process comprises aligning the support structure.

14. The lithographic apparatus of claim 1, wherein the process comprises settling the support structure after aligning.

15. The lithographic apparatus of claim 1, wherein the process comprises aligning the patterning device.

16. The lithographic apparatus of claim 1, wherein the process comprises settling the patterning device after aligning.

17. The lithographic apparatus of claim 1, wherein the process comprises aligning the projection system.

18. The lithographic apparatus of claim 1, wherein the process comprises tilting the substrate.

19. The lithographic apparatus of claim 18, wherein the process comprises settling after tilting.

20. The lithographic apparatus of claim 1, wherein the process comprises focusing the projection system.

21. The lithographic apparatus of claim 1, wherein the process comprises exposing the substrate to the patterned beam.

22. The lithographic apparatus of claim 1, further comprising a control unit configured to determine at least a process time for obtaining a required accuracy and/or a process accuracy for obtaining a required processing time period.

23. A device manufacturing method, comprising:
providing a substrate that is at least partially covered by a layer of radiation-sensitive material;
conditioning a beam of radiation;
applying a patterning device to configure the conditioned beam of radiation with a desired pattern in its cross-section;
projecting the patterned beam of radiation onto a target portion of the substrate; and
selecting one out of at least two different operational modes,
wherein a first operational mode is associated with performing a process within a first time period at a first level of accuracy and a second operational mode is associated with performing the process within a second time period at a second level of accuracy, and
wherein the first time period is shorter than the second time period and the first level of accuracy is lower than the second level of accuracy.

24. The device manufacturing method of claim 23, further comprising controlling the selecting of the operational modes by a user.

* * * * *